(12) United States Patent
Liao

(10) Patent No.: US 10,854,720 B2
(45) Date of Patent: Dec. 1, 2020

(54) SEMICONDUCTOR DEVICE MANUFACTURING METHOD

(71) Applicant: DELTA ELECTRONICS, INC., Taoyuan (TW)

(72) Inventor: Wen-Chia Liao, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/262,352

(22) Filed: Jan. 30, 2019

(65) Prior Publication Data

US 2019/0172915 A1 Jun. 6, 2019

Related U.S. Application Data

(62) Division of application No. 14/724,963, filed on May 29, 2015, now Pat. No. 10,229,978.

(60) Provisional application No. 62/008,600, filed on Jun. 6, 2014.

(51) Int. Cl.

| H01L 29/40 | (2006.01) |
| H01L 29/66 | (2006.01) |
| H01L 23/31 | (2006.01) |
| H01L 29/778 | (2006.01) |
| H01L 23/29 | (2006.01) |
| H01L 29/10 | (2006.01) |
| H01L 29/20 | (2006.01) |

(52) U.S. Cl.
CPC ........ *H01L 29/402* (2013.01); *H01L 23/3171* (2013.01); *H01L 29/66462* (2013.01); *H01L 29/7786* (2013.01); *H01L 23/291* (2013.01); *H01L 29/1066* (2013.01); *H01L 29/2003* (2013.01); *H01L 29/404* (2013.01); *H01L 2924/0002* (2013.01)

(58) Field of Classification Search
None
See application file for complete search history.

(56) References Cited

U.S. PATENT DOCUMENTS

| 2002/0182810 A1 | 12/2002 | Oh |
| 2006/0175670 A1 | 8/2006 | Tsubaki |
| 2008/0093626 A1 | 4/2008 | Kuraguchi |

(Continued)

FOREIGN PATENT DOCUMENTS

| CN | 103227198 | 7/2013 |
| CN | 103367403 | 10/2013 |

(Continued)

*Primary Examiner* — David E Graybill
(74) *Attorney, Agent, or Firm* — Hauptman Ham, LLP

(57) ABSTRACT

A semiconductor device includes a substrate, an active layer, a source electrode, a drain electrode, a p-type doped layer, a gate electrode, a passivation layer, and a field plate. The active layer is disposed on the substrate. The source electrode, the drain electrode and the p-type doped layer are disposed on the active layer. The p-type doped layer is disposed between the source electrode and the drain electrode, and has a first thickness. The gate electrode is disposed on the p-type doped layer. The passivation layer covers the gate electrode and the active layer. The field plate is disposed on the passivation layer and is electrically connected to the source electrode. The field plate includes a field dispersion portion disposed between the gate electrode and the drain electrode. The passivation layer between the field dispersion portion and the active layer has a second thickness smaller than the first thickness.

3 Claims, 10 Drawing Sheets

(56) References Cited

U.S. PATENT DOCUMENTS

| | | |
|---|---|---|
| 2011/0272740 A1 | 11/2011 | Umeda et al. |
| 2012/0018735 A1 | 1/2012 | Ishii |
| 2012/0119261 A1 | 5/2012 | Umeda et al. |
| 2012/0139008 A1 | 6/2012 | Imada et al. |
| 2012/0187451 A1 | 7/2012 | Saito |
| 2012/0220089 A1 | 8/2012 | Imada et al. |
| 2012/0235210 A1 | 9/2012 | Takemae et al. |
| 2013/0193485 A1 | 8/2013 | Akiyama et al. |
| 2014/0061659 A1 | 3/2014 | Teplik et al. |
| 2014/0209922 A1 | 7/2014 | Ota et al. |
| 2014/0239346 A1 | 8/2014 | Green et al. |
| 2014/0361341 A1 | 12/2014 | Sriram et al. |
| 2014/0361343 A1 | 12/2014 | Siriram |

FOREIGN PATENT DOCUMENTS

| | | |
|---|---|---|
| TW | 200840045 | 10/2008 |
| TW | 201030973 | 8/2010 |
| TW | 201242026 | 10/2012 |
| TW | 201314894 | 4/2013 |
| TW | 201324773 | 6/2013 |
| TW | 201417286 | 5/2014 |

SEMICONDUCTOR DEVICE MANUFACTURING METHOD

RELATED APPLICATIONS

This application is a Divisional Application of the U.S. application Ser. No. 14/724,963, filed May 29, 2015, which claims priority to U.S. Provisional Patent Application Ser. No. 62/008,600, filed Jun. 6, 2014, which are herein incorporated by reference in their entireties.

BACKGROUND

Field of Invention

The present invention relates to a semiconductor device.

Description of Related Art

As a form of a field effect transistor (FET), a high electron mobility transistor (HEMT) is widely used in the art because of its high electron mobility and low resistance. The key element within a HEMT is a heterojunction formed by two materials with different band gaps instead of a pn-junction used in the conventional FET. A commonly used material combination is AlGaN and GaN. Since the heterojunction created by AlGaN and GaN forms a quantum well in the conduction band on the GaN side, a two-dimensional electron gas (2DEG) appears at the interface of AlGaN and GaN.

SUMMARY

An aspect of the present invention is to provide a semiconductor device including a substrate, an active layer, a source electrode, a drain electrode, a p-type doped layer, a gate electrode, a first passivation layer, and a field plate. The active layer is disposed on the substrate. The source electrode and the drain electrode are disposed on or above the active layer. The p-type doped layer is disposed on the active layer and between the source electrode and the drain electrode. The p-type doped layer has a first thickness. The gate electrode is disposed on the p-type doped layer. The first passivation layer covers at least the gate electrode and the active layer. The field plate is disposed on or above the first passivation layer and electrically connected to the source electrode. The field plate includes a field dispersion portion disposed between the gate electrode and the drain electrode. The first passivation layer has a second thickness between the field dispersion portion and the active layer. The second thickness is smaller than the first thickness.

In one or more embodiments, the field plate and the source electrode are integrally formed.

In one or more embodiments, the field plate further includes an extending portion connecting to the field dispersion portion and the source electrode. At least a portion of the extending portion is disposed above the gate electrode.

In one or more embodiments, the field dispersion portion has a step facing the active layer.

In one or more embodiments, the semiconductor device further includes a second passivation layer covering at least the first passivation layer and the field dispersion portion of the field plate.

In one or more embodiments, the field plate further includes an extending portion and a conductive element. The extending portion is electrically connected to the source electrode and is disposed on the second passivation layer. The conductive element is electrically connected to the extending portion and the field dispersion portion.

In one or more embodiments, the passivation layer has a through hole to expose the field dispersion portion, and the field plate further includes an extending portion and a conductive element. The extending portion is electrically connected to the source electrode and is disposed on the second passivation layer, and the conductive element is disposed in the through hole to be electrically connected to the extending portion and the field dispersion portion.

In one or more embodiments, the semiconductor device further includes an insulating layer and a second passivation layer. The insulating layer is disposed on the first passivation layer and the field dispersion portion. The second passivation layer is deposed on the insulating layer. The field plate further includes an extending portion and an interlayer portion. The extending portion is disposed on the second passivation layer. The interlayer portion is disposed between the extending portion and the field dispersion portion and between the insulating layer and the second passivation portion.

In one or more embodiments, the second thickness T2 satisfies 0<T2<100 nm.

In one or more embodiments, the p-type doped layer is made of GaN or AlGaN doped with p-type dopants.

Another aspect of the present invention is to provide a method for manufacturing a semiconductor device. A substrate is provided. An active layer is formed on the substrate. A p-type doped layer is formed on the active layer. A gate electrode is formed on the p-type doped layer. The p-type doped layer out of gate electrode is etched. A passivation layer is formed to cover the gate electrode and the active layer. A source via hole, a drain via hole, and a blind hole are formed in the passivation layer. The p-type doped layer is disposed between the source via hole and the blind hole, the blind hole is disposed between the p-type doped layer and the drain via hole, and a portion of the passivation layer under the blind hole has a second thickness smaller than the first thickness. A source electrode, a field plate, and a drain electrode are respectively formed in the source via hole, the blind hole, and the drain via hole.

In one or more embodiments, the p-type doped layer is made of GaN or AlGaN doped with p-type dopants.

In one or more embodiments, forming the blind hole includes forming a step at a side of the blind hole facing the active layer.

Yet another embodiment of the present invention is to provide a method for manufacturing a semiconductor device. A substrate is provided. An active layer is formed on the substrate. A p-type doped layer is formed on the active layer. A gate electrode is formed on the p-type doped layer. The p-type doped layer out of the gate electrode is etched. A first passivation layer is formed to cover the gate electrode and the active layer. A field dispersion portion of a field plate is formed on the first passivation layer. A portion of the first passivation layer between the field dispersion portion and the active layer has a second thickness smaller than the first thickness. A second passivation layer is formed to cover the field dispersion portion and the first passivation layer. A source via hole and a drain via hole are formed in the second passivation layer and a source via hole and a drain via hole are formed in the first passivation layer. The source via hole of the first passivation layer and the source via hole of the second passivation layer together expose a portion of the active layer, and the drain via hole of the first passivation layer and the drain via hole of the second passivation layer together expose another portion of the active layer. The p-type doped layer is disposed between the source via holes and the field dispersion portion. The field dispersion portion is disposed between the p-type doped layer and the drain via holes. A source electrode is formed in the source via holes. A drain electrode is formed in the drain via holes. An extending portion of the field plate is formed on the second passivation layer to be electrically connected to the source electrode. A conductive element of the field plate is formed to electrically connect the field dispersion portion to the extending portion.

In one or more embodiments, the p-type doped layer is made of GaN or AlGaN doped with p-type dopants.

In one or more embodiments, the method further includes forming a through hole in the second passivation layer to expose the field dispersion portion. The conductive element is formed in the through hole.

In one or more embodiments, the method further includes forming an insulating layer to cover the field dispersion portion and the first passivation layer. An interlayer portion of the field plate is formed on the insulating layer and above the field dispersion portion. The second passivation layer further covers the insulating layer and the interlayer portion. A source via hole and a drain via hole are formed in the insulating layer. The source electrode is formed in the source via holes, and the drain electrode is formed in the drain via holes.

DETAILED DESCRIPTION

Figure 1A:
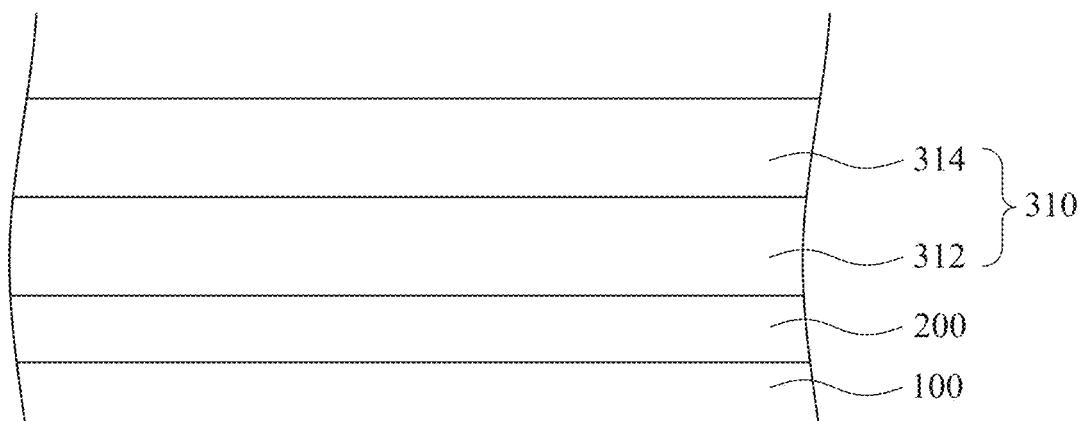
FIG. 1A to FIG. 1F are cross-sectional views of different stages of a method for manufacturing a semiconductor device according to the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1F are cross-sectional views of different stages of a method for manufacturing a semiconductor device according to the first embodiment of the present invention. As shown in FIG. 1A, a substrate 100 is provided first. Subsequently, a buffer layer 200 may be optionally formed on the substrate 100. In this embodiment, the substrate 100 can be made of sapphire, Si, or SiC, and the buffer layer 200 can be made of AlN or other suitable materials. Then, an active layer 310 can be formed on or above the substrate 100. For example, in FIG. 1A, the active layer 310 is formed above the substrate 100 and on the buffer layer 200.

In one or more embodiments, the active layer 310 includes a channel layer 312 and a barrier layer 314. The channel layer 312 is formed above the substrate 100 and on the buffer layer 200, and then the barrier layer 314 is formed on the channel layer 312. The active layer 310 can be performed by metal organic chemical vapor deposition (MOCVD), the channel layer 312 may be made of GaN, and the barrier layer 314 may be made of AlGaN.

Figure 1B:
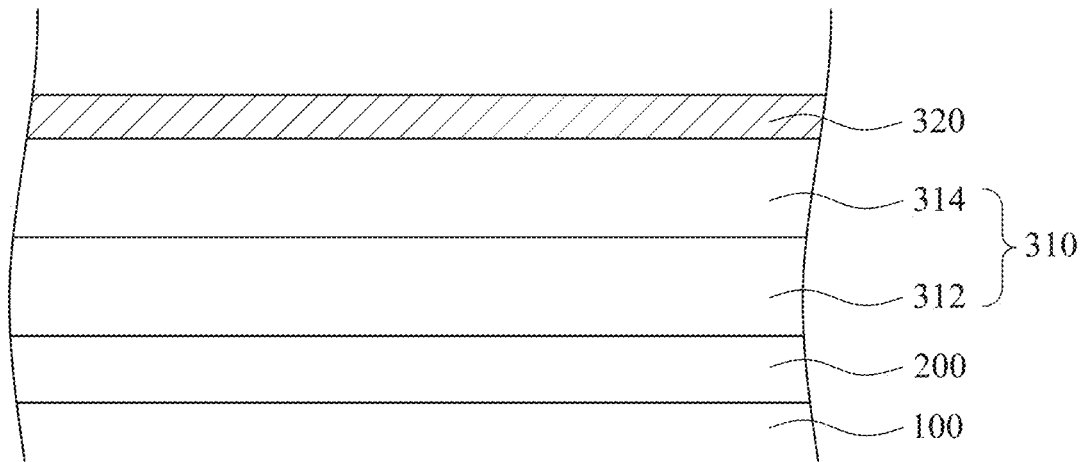
Figure 1C:
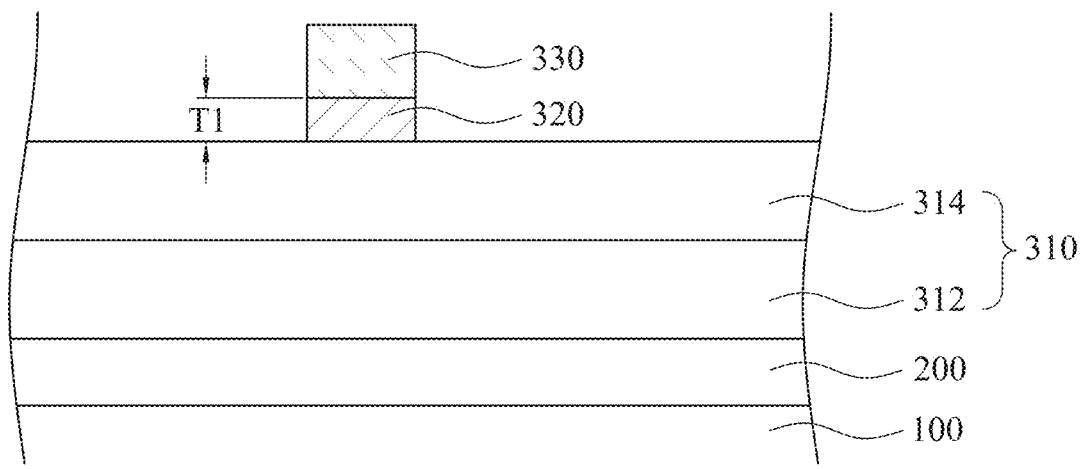

Reference is made to FIGS. 1B and 1C. As FIG. 1B shows, an unpatterned p-type doped layer 320 can be formed on the active layer 310. As FIG. 1C shows, a gate electrode 330 can be formed on a patterned p-type doped layer 320, and the patterned p-type doped layer 320 of FIG. 1O can be formed by etching. For example, a metal layer can be formed to cover the patterned p-type doped layer 320. Subsequently, the metal layer can be patterned to form the gate electrode 330. In this embodiment, the p-type doped layer 320 has a first thickness T1, which is about 100 nm, and the p-type doped layer 320 can be made of GaN or AlGaN doped with p-type dopants. The metal layer can be deposited by e-beam evaporator, and patterning the metal layer can be performed by lithography and etching process.

Figure 1D:
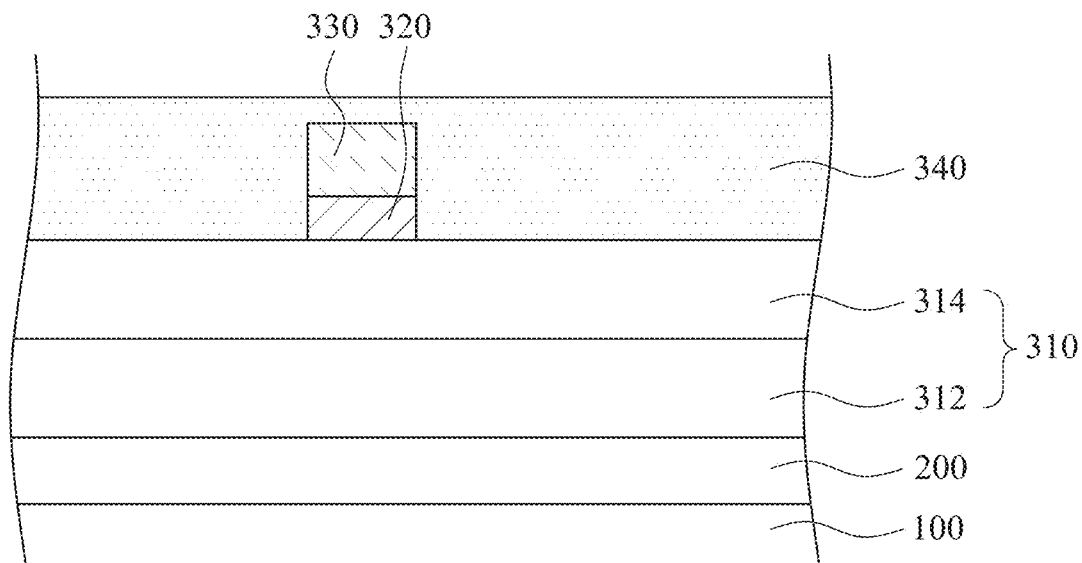

Reference is made to FIG. 1D. A passivation layer 340 is formed to cover the gate electrode 330 and the active layer 310. In this embodiment, the passivation layer 340 can be made of aluminum oxide ($Al_2O_3$), aluminum nitride (AlN), silicon nitride ($Si_3N_4$), silicon oxide ($SiO_2$), hafnium oxide ($HfO_2$), or any combination thereof, and the passivation layer 340 can be deposited by plasma enhanced chemical vapor deposition.

Figure 1E:
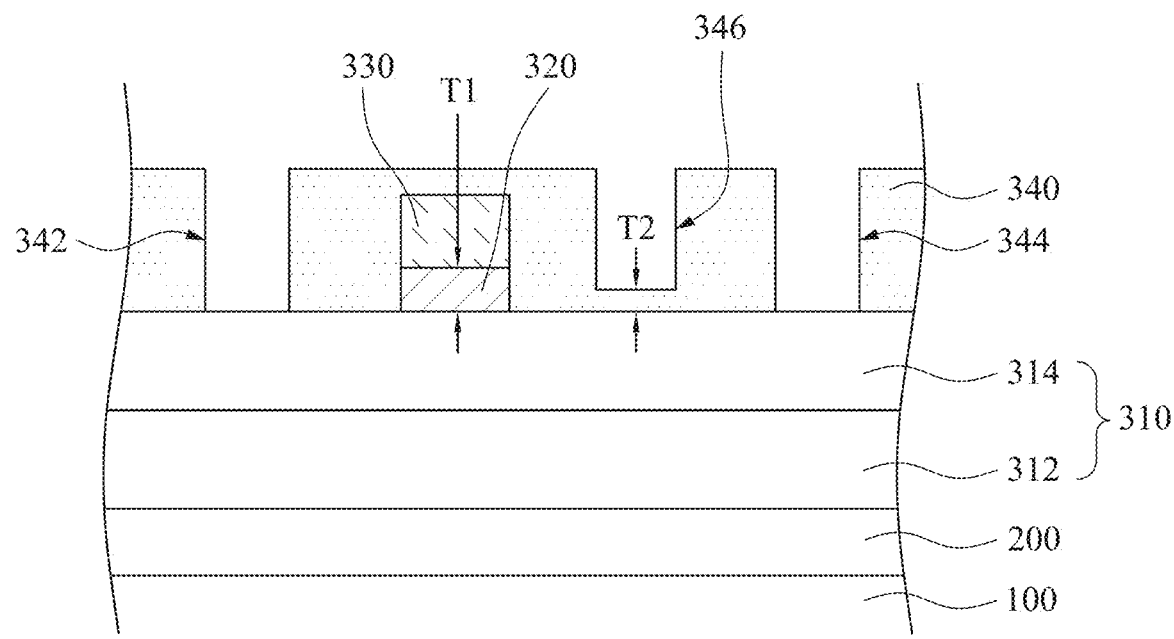

Reference is made to FIG. 1E. A source via hole 342, a drain via hole 344, and a blind hole 346 are formed in the passivation layer 340. The p-type doped layer 320 is disposed between the source via hole 342 and the blind hole 346. The blind hole 346 is disposed between the p-type doped layer 320 and the drain via hole 344. A portion of the passivation layer 340 under the blind hole 346 has a second thickness T2 smaller than the first thickness T1. That is, 0<T2<100 nm in this embodiment. The source via hole 342, the drain via hole 344, and the blind hole 346 can be performed by lithography and etching process.

Figure 1F:
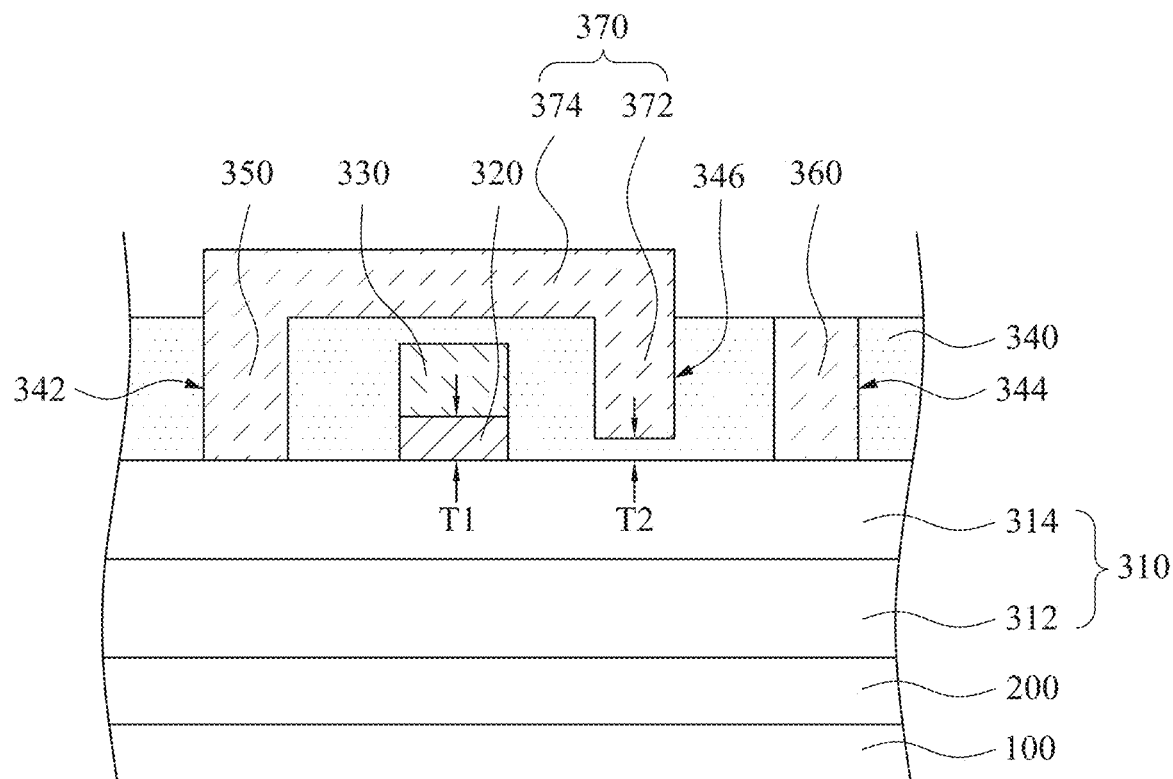

Reference is made to FIG. 1F. A source electrode 350 is formed in the source via hole 342, a drain electrode 360 is formed in the drain via hole 344, and a field plate 370 is formed in the blind hole 346 to be electrically connected to the source electrode 350. For example, another metal layer can be formed to cover the passivation layer 340 and is filled in all of the source via hole 342, the drain via hole 344, and the blind hole 346. Then, the metal layer can be patterned to form the source electrode 350, the drain electrode 360, and the field plate 370. In this embodiment, the metal layer can be deposited by e-beam evaporator, and patterning the metal layer can be performed by lithography and etching process.

Structurally, the semiconductor device includes the substrate 100, active layer 310, the source electrode 350, the drain electrode 360, the p-type doped layer 320, the gate electrode 330, the passivation layer 340, and the field plate 370. The active layer 310 is disposed on the substrate 100. The source electrode 350 and the drain electrode 360 are disposed on the active layer 310. The p-type doped layer 320 is disposed on the active layer 310 and between the source electrode 350 and the drain electrode 360. The p-type doped layer 320 has the first thickness T1. The gate electrode 330 is disposed on the p-type doped layer 320. The passivation layer 340 covers at least the gate electrode 330 and the active layer 310. The field plate 370 is disposed on or above the passivation layer 340 and is electrically connected to the source electrode 350. The field plate 370 includes a field dispersion portion 372 filled in the blind hole 346. That is, the field dispersion portion 372 is disposed between the gate electrode 330 and the drain electrode 360. The portion of the passivation layer 340 between the field dispersion portion 372 and the active layer 310 has the second thickness T2 smaller than the first thickness T1.

In this embodiment, the p-type doped layer 320 can be a layer that suppresses electrons in the active layer 310 underneath the gate electrode 330. This effect even appears without applying an external voltage. Hence, the semiconductor device in this embodiment is a normally-off (i.e., enhancement mode) device. In addition, the semiconductor device in this embodiment includes the field plate 370 to manipulate the electric field distribution in the semiconductor device. Structurally, the field plate 370 includes the field dispersion portion 372 filled in the blind hole 346, and the field plate 370 further includes an extending portion 374 cross over the gate electrode 330 to be electrically connected to the field dispersion portion 372 and the source electrode 350. In greater detail, a high electric field is generated between the gate electrode 330 and the active layer 310. Once a source-drain voltage is applied to the semiconductor device, the electrical field may be increased rapidly so as to achieve the break down voltage of the semiconductor device. In this embodiment, however, since the field dispersion portion 372 is disposed between the gate electrode 330 and the drain electrode 360, and the second thickness T2 is smaller than the first thickness T1, i.e., the field dispersion portion 372 is lower than the gate electrode 330, a portion of the electric field can be shifted to the field dispersion portion 372 effectively as this device biased into high Vds and the increasing degree of the electric field at gate electrode 330 edge of the drain side can be abated.

Figure 2A:
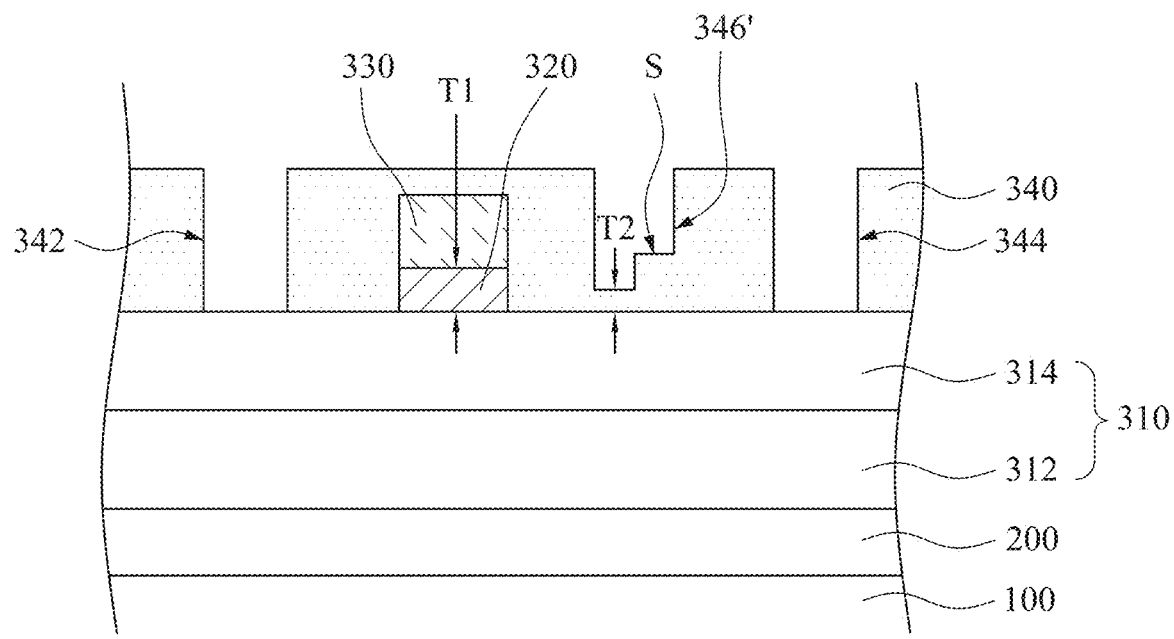
FIG. 2A to FIG. 2B are cross-sectional views of different stages of a method for manufacturing a semiconductor device according to the second embodiment of the present invention.
Figure 2B:
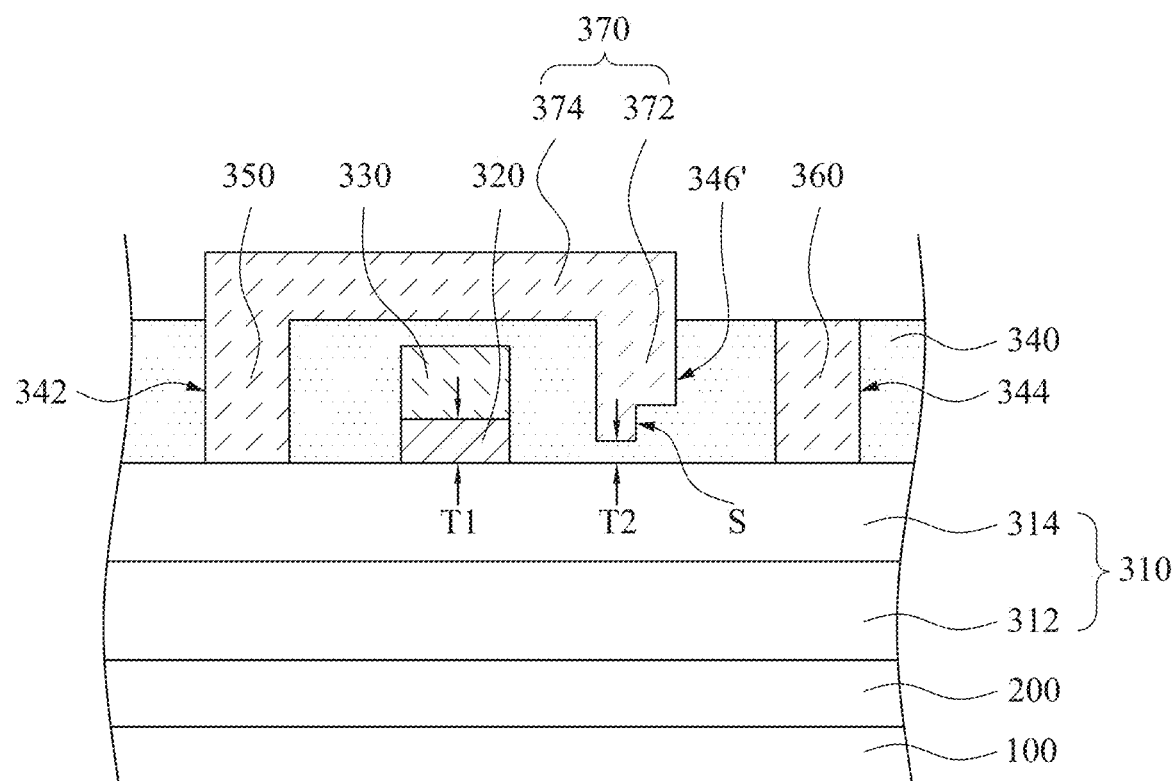

Reference is made to FIGS. 2A and 2B which are cross-sectional views of different stages of a method for manufacturing a semiconductor device according to the second embodiment of the present invention. The difference between the second embodiment and the first embodiment pertains to the shape of the blind hole 346. Reference is made to FIG. 2A. The manufacturing processes of FIG. 1A to FIG. 1D are performed first. Since the relevant manufacturing details are all the same as the first embodiment, and, therefore, a description in this regard will not be repeated hereinafter. Subsequently, a source via hole 342, a drain via hole 344, and a blind hole 346' are formed in the passivation layer 340, and a step S is formed at a side of the blind hole 346' facing the active layer 310. The p-type doped layer 320 is disposed between the source via hole 342 and the blind hole 346'. The blind hole 346' is disposed between the p-type doped layer 320 and the drain via hole 344. At least a portion of the passivation layer 340 under the blind hole 346' has a second thickness T2 smaller than the first thickness T1. In this embodiment, the source via hole 342, the drain via hole 344, and the blind hole 346' can be performed by lithography and etching process.

Reference is made to FIG. 2B. A source electrode 350 is formed in the source via hole 342, a drain electrode 360 is formed in the drain via hole 344, and a field plate 370 is formed to be electrically connected to the source electrode 350, wherein a field dispersion portion 372 of the field plate 370 is formed in the blind hole 346'. For example, another metal layer can be formed to cover the passivation layer 340 and is filled in all of the source via hole 342, the drain via hole 344, and the blind hole 346'. Then, the metal layer can be patterned to form the source electrode 350, the drain electrode 360, and the field plate 370. In this embodiment, the metal layer can be deposited by e-beam evaporator, and patterning the metal layer can be performed by lithography and etching process.

Structurally, the difference between the second embodiment and the first embodiment pertains to the shape of the blind hole 346'. In this embodiment, the field dispersion portion 372 of the field plate 370 has a step S facing the active layer 310. Since the portion of the passivation layer 340 under the blind hole 346' has the second thickness T2 smaller than the first thickness T1, the field dispersion portion 372 is able to disperse the electric field between the p-type doped layer 320 and the active layer 310 efficiently. Other relevant structural details of the second embodiment are all the same as the first embodiment, and, therefore, a description in this regard will not be repeated hereinafter.

Figure 3A:
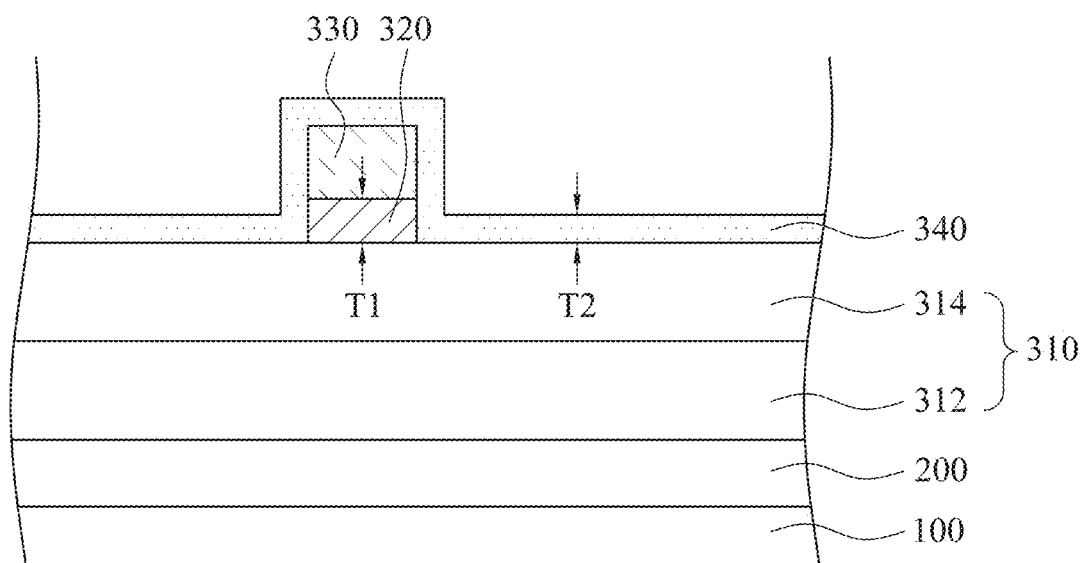
FIG. 3A to FIG. 3F are cross-sectional views of different stages of a method for manufacturing a semiconductor device according to the third embodiment of the present invention.

Reference is made to FIGS. 3A to 3F which are cross-sectional views of different stages of a method for manufacturing a semiconductor device according to the third embodiment of the present invention. The difference between the third embodiment and the first embodiment pertains to the configuration of the field plate 370. Reference is made to FIG. 3A. The manufacturing processes of FIG. 1A to FIG. 1O are performed first. Since the relevant manufacturing details are all the same as the first embodiment, and, therefore, a description in this regard will not be repeated hereinafter. Subsequently, a first passivation layer 340 is formed to cover the gate electrode 330 and the active layer 310. In this embodiment, the first passivation layer 340 has a second thickness T2 smaller than the first thickness T1. The first passivation layer 340 can be made of aluminum oxide ($Al_2O_3$), aluminum nitride (AlN), silicon nitride ($Si_3N_4$), silicon oxide ($SiO_2$), hafnium oxide ($HfO_2$), or any combination thereof, and the first passivation layer 340 can be deposited by plasma enhanced chemical vapor deposition.

Figure 3B:
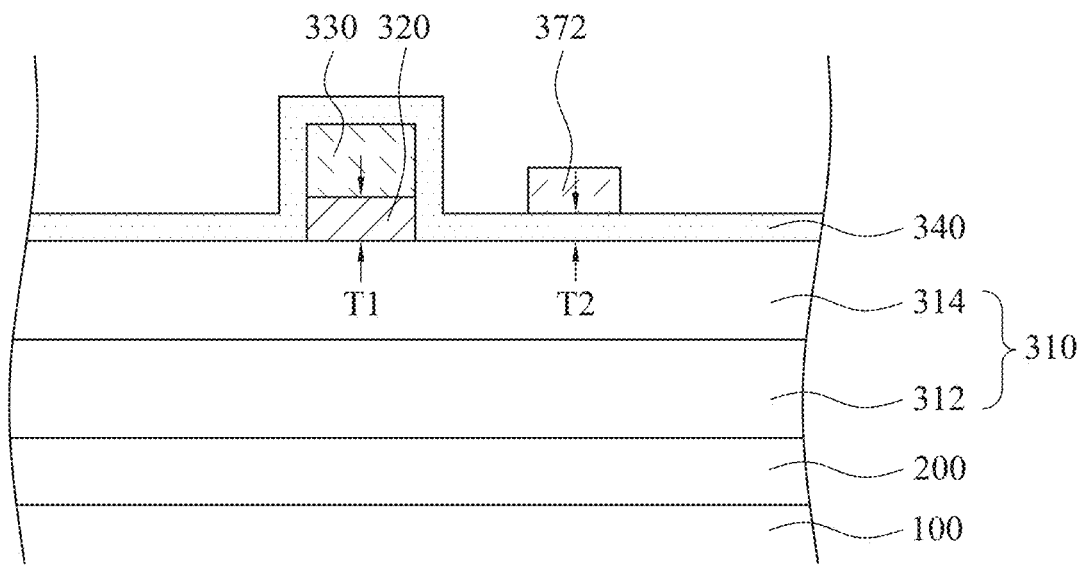

Reference is made to FIG. 3B. A field dispersion portion 372 is formed on the first passivation layer 340. For example, a metal layer can be formed to cover the first passivation layer 340. Then, the metal layer can be patterned to form the field dispersion portion 372. In this embodiment, the metal layer can be deposited by e-beam evaporator and be patterned by lithography and etching process.

Figure 3C:
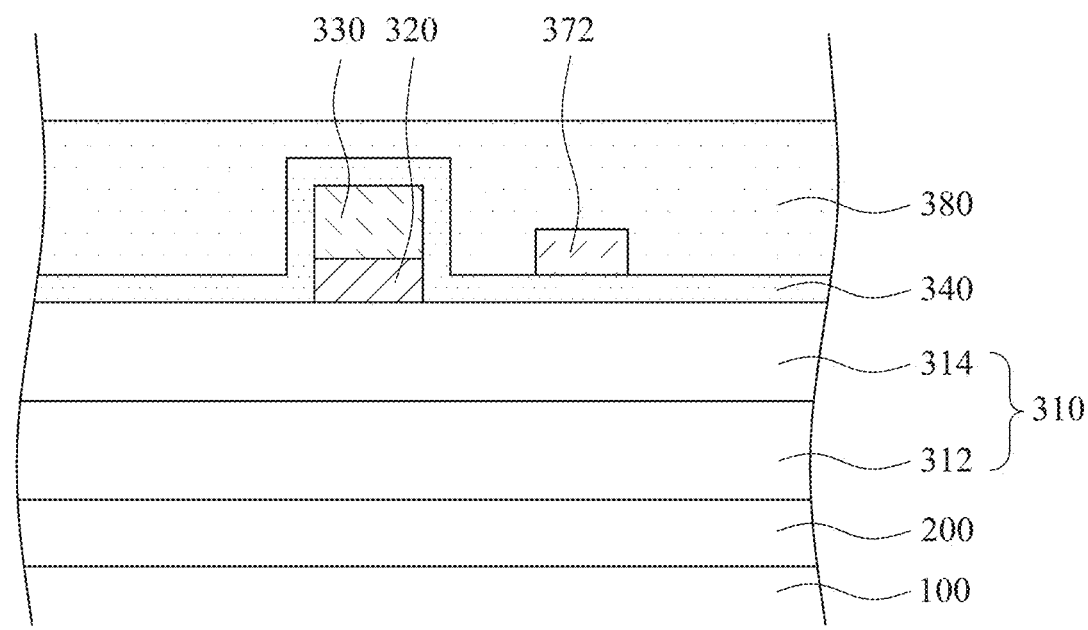

Reference is made to FIG. 3C. A second passivation layer 380 is formed to cover the field dispersion portion 372 and the first passivation layer 340. The second passivation layer 380 can be made of aluminum oxide ($Al_2O_3$), aluminum nitride (AlN), silicon nitride ($Si_3N_4$), silicon oxide ($SiO_2$), hafnium oxide ($HfO_2$), or any combination thereof, and the second passivation layer 380 can be deposited by plasma enhanced chemical vapor deposition.

Figure 3D:
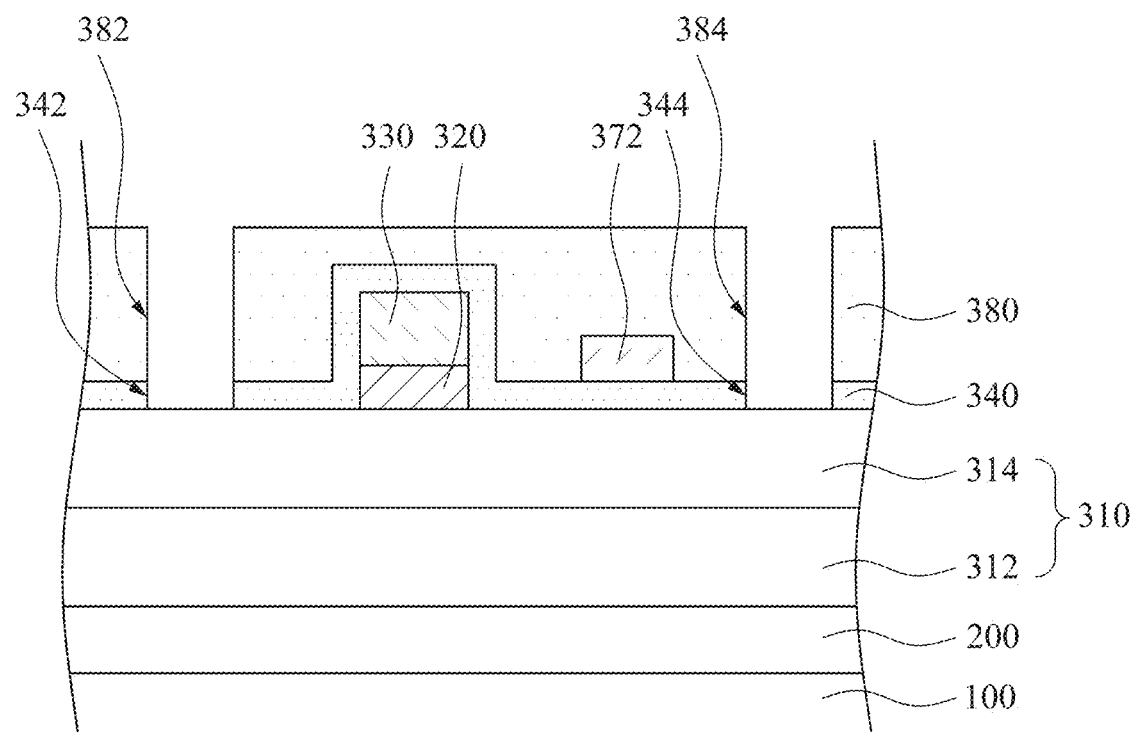

Reference is made to FIG. 3D. Subsequently, a source via hole 382 and a drain via hole 384 are formed in the second passivation layer 380 and a source via hole 342 and a drain via hole 344 are formed in the first passivation layer 340. The source via holes 382 and 342 together expose a portion of the active layer 310, and the drain via holes 384 and 344 together expose another portion of the active layer 310. The p-type doped layer 320 is disposed between the source via holes 382 and 342 and the field dispersion portion 372, and the field dispersion portion 372 is disposed between the p-type doped layer 320 and the drain via holes 384 and 344. In this embodiment, the source via holes 342 and 382, and the drain via holes 344 and 384 can be performed by lithography and etching process.

Figure 3E:
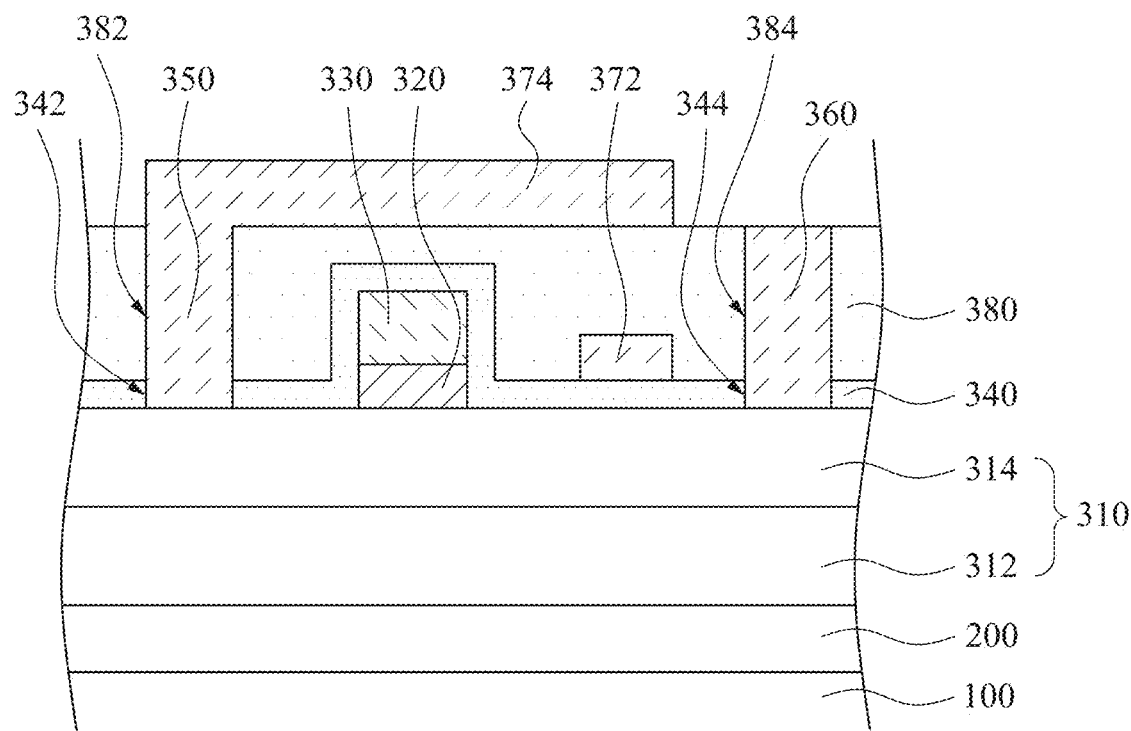

Reference is made to FIG. 3E. A source electrode 350 is formed in the source via holes 342 and 382, a drain electrode 360 is formed in the drain via holes 344 and 384, and an extending portion 374 is formed on the second passivation layer 380 to be electrically connected to the source electrode 350. For example, another metal layer can be formed to cover the second passivation layer 380 and is filled in all of the source via holes 342 and 382, and the drain via holes 344 and 384. Then, the metal layer can be patterned to form the source electrode 350, the drain electrode 360, and the extending portion 374. In this embodiment, the metal layer can be deposited by e-beam evaporator and be patterned by lithography and etching process.

Figure 3F:
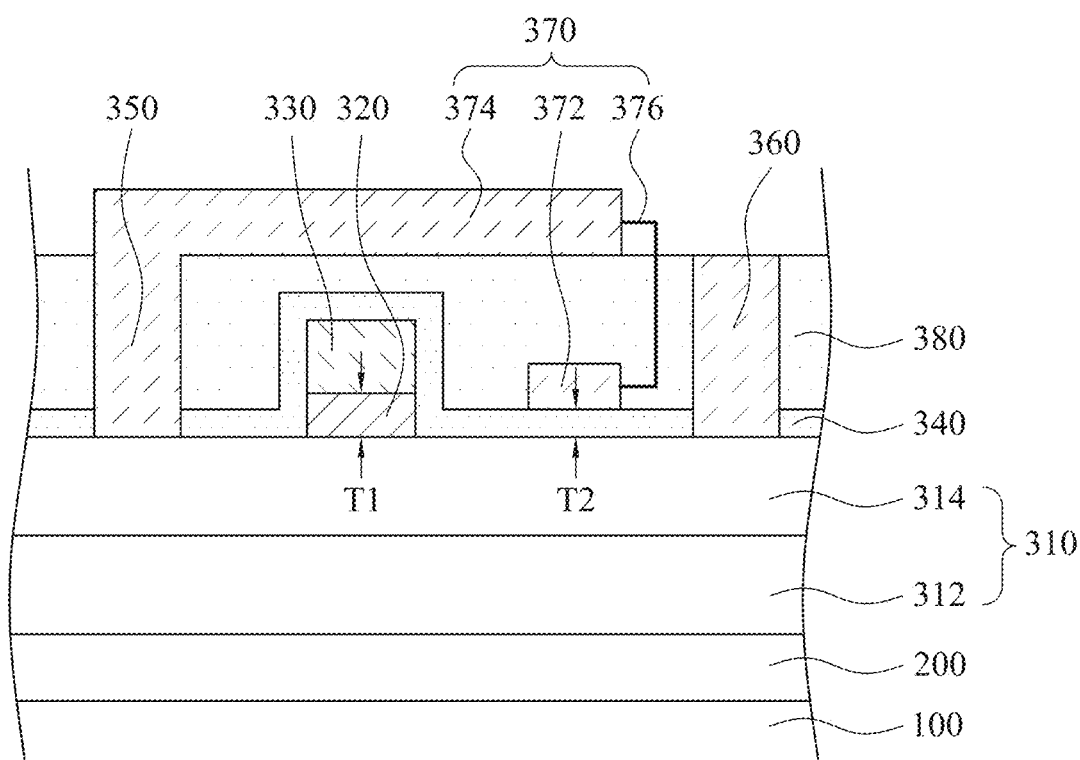

Reference is made of FIG. 3F. Subsequently, a conductive element 376 can be formed to electrically connect the field dispersion portion 372 to the extending portion 374. Therefore, the field dispersion portion 372, the extending portion 374, and the conductive element 376 form a field plate 370 that is connected to the source electrode 350. In this embodiment, the conductive element 376 may be, but not limited to be, a wire.

Structurally, the difference between the third embodiment and the first embodiment pertains to the configuration of the field plate 370. In this embodiment, the field plate 370 includes the field dispersion portion 372, the extending portion 374, and the conductive element 376. Since the portion of the first passivation layer 340 under the field dispersion portion 372 has the second thickness T2 smaller than the first thickness T1, the field dispersion portion 372 is able to disperse the electric field between the p-type doped layer 320 and the active layer 310 efficiently. Other relevant structural details of the third embodiment are all the same as the first embodiment, and, therefore, a description in this regard will not be repeated hereinafter.

Figure 4A:
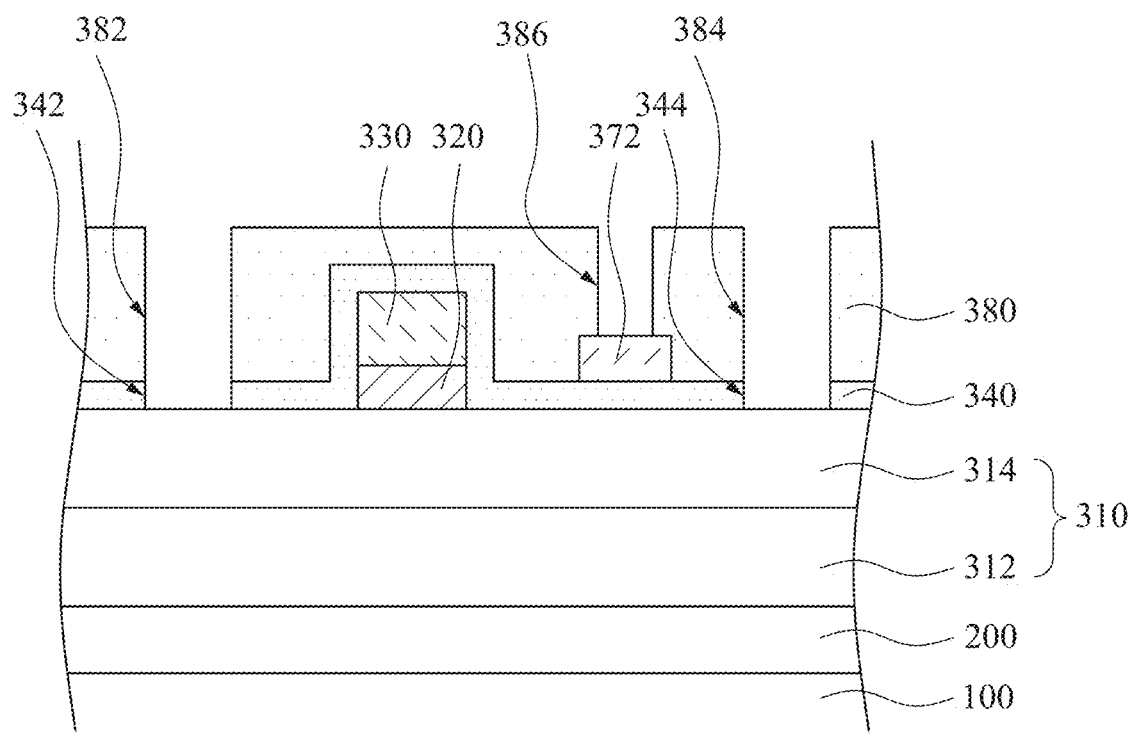
FIGS. 4A and 4B are cross-sectional views of different stages of a method for manufacturing a semiconductor device according to the fourth embodiment of the present invention.
Figure 4B:
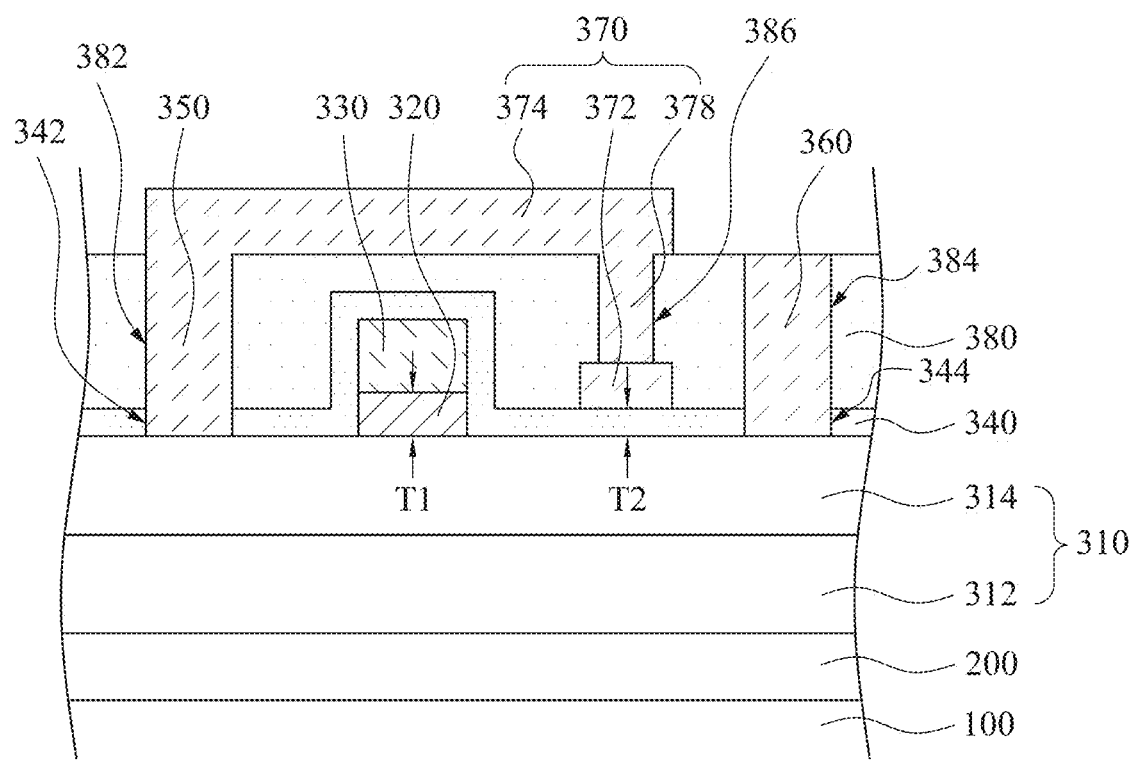

Reference is made to FIGS. 4A and 4B which are cross-sectional views of different stages of a method for manufacturing a semiconductor device according to the fourth embodiment of the present invention. The difference between the fourth embodiment and the third embodiment pertains to the connection between the field dispersion portion 372 and the extending portion 374. Reference is made to FIG. 4A. The manufacturing processes of FIG. 1A to FIG. 1O, and FIG. 3A to FIG. 3C are performed first. Since the relevant manufacturing details are all the same as the first and the third embodiments, and, therefore, a description in this regard will not be repeated hereinafter. Subsequently, a source via hole 382, a drain via hole 384, and a through hole 386 are formed in the second passivation layer 380, and a source via hole 342 and a drain via hole 344 are formed in the first passivation layer 340. The source via holes 382 and 342 together expose a portion of the active layer 310, the drain via holes 384 and 344 together expose another portion of the active layer 310, and the through hole 386 exposes the field dispersion portion 372. The p-type doped layer 320 is disposed between the source via holes 382 and 342 and the field dispersion portion 372, and the field dispersion portion 372 and the through hole 386 are disposed between the p-type doped layer 320 and the drain via holes 384 and 344. In this embodiment, the source via holes 342 and 382, the drain via holes 344 and 384, and the through hole 386 can be performed by lithography and etching process.

Reference is made to FIG. 4B. A source electrode 350 is formed in the source via holes 342 and 382, a drain electrode 360 is formed in the drain via holes 344 and 384, an extending portion 374 is formed on the second passivation layer 380 to be electrically connected to the source electrode 350, and a conductive element 378 is formed in the through hole 386 to be electrically connected to the field dispersion portion 372. For example, another metal layer can be formed to cover the second passivation layer 380 and is filled in all of the source via holes 342 and 382, the drain via holes 344 and 384, and the through hole 386. Then, the metal layer can be patterned to form the source electrode 350, the drain electrode 360, the extending portion 374, and the conductive element 378. In this embodiment, the metal layer can be deposited by e-beam evaporator and be patterned by lithography and etching process.

Structurally, the difference between the fourth embodiment and the third embodiment pertains to the configuration of the conductive element 378. In this embodiment, the field plate 370 includes the field dispersion portion 372, the extending portion 374, and the conductive element 378. The conductive element 378 is disposed in the through hole 386. Since the portion of the first passivation layer 340 under the field dispersion portion 372 has the second thickness T2 smaller than the first thickness T1, the field dispersion portion 372 is able to disperse the electric field between the p-type doped layer 320 and the active layer 310 efficiently. Other relevant structural details of the fourth embodiment are all the same as the third embodiment, and, therefore, a description in this regard will not be repeated hereinafter.

Figure 5A:
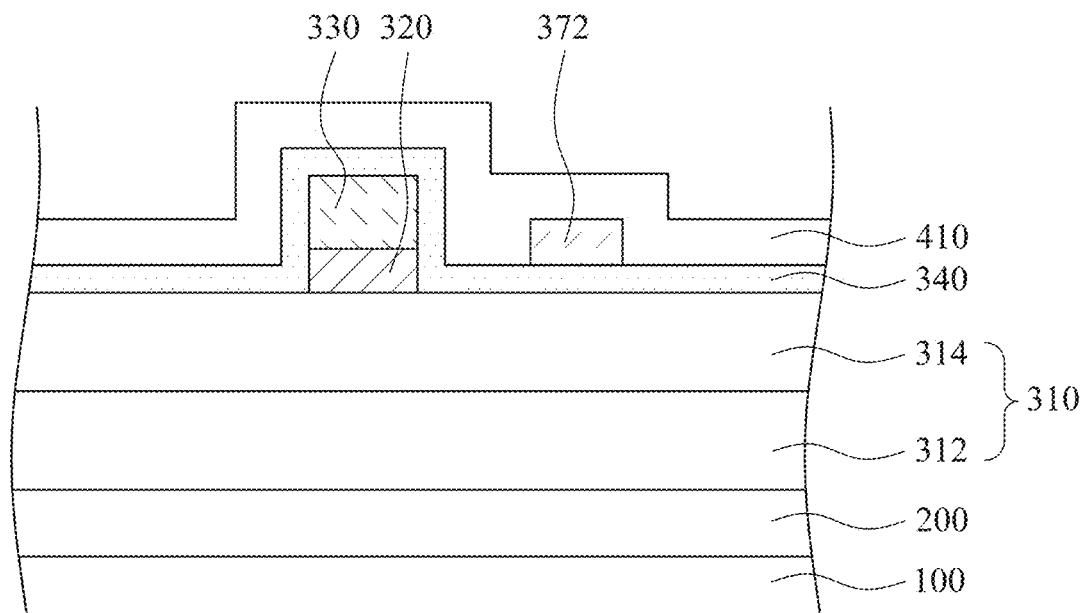
FIGS. 5A to 5D are cross-sectional views of different stages of a method for manufacturing a semiconductor device according to the fifth embodiment of the present invention.
Figure 5B:
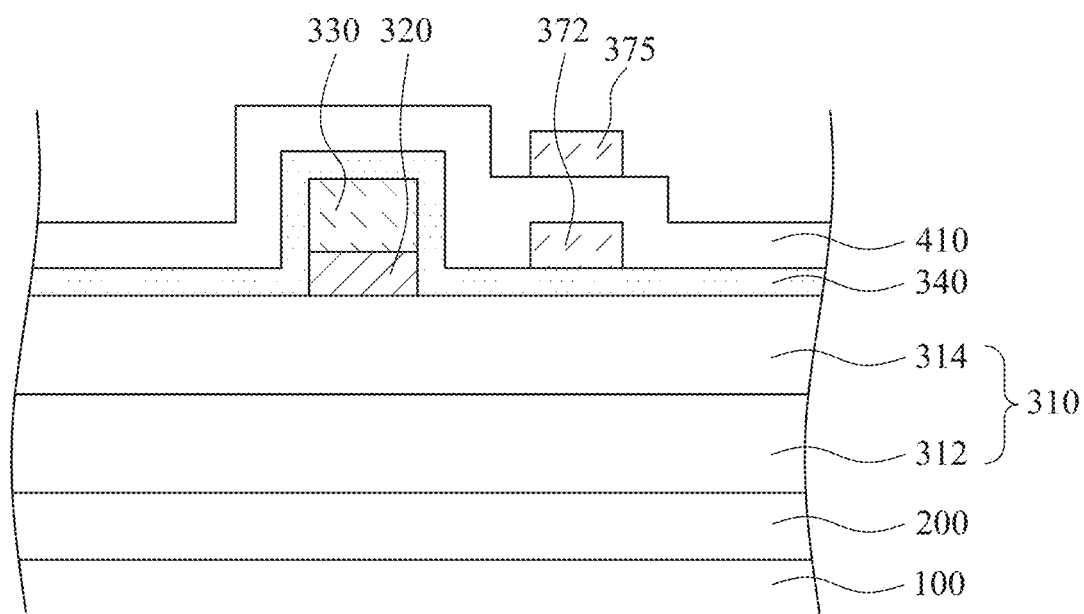
Figure 5C:
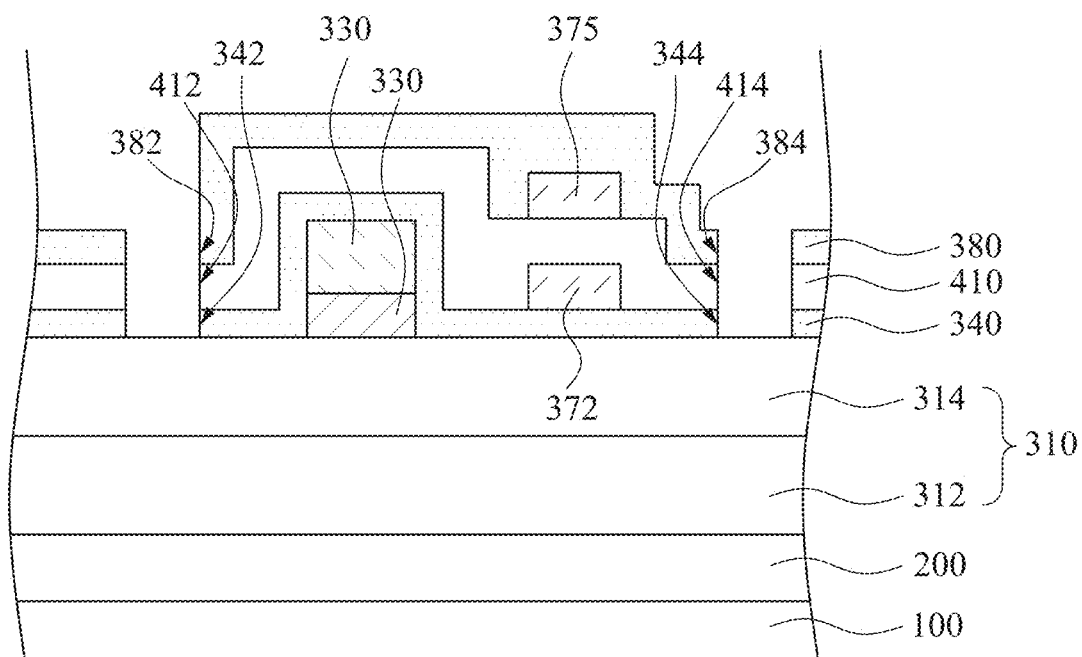
Figure 5D:
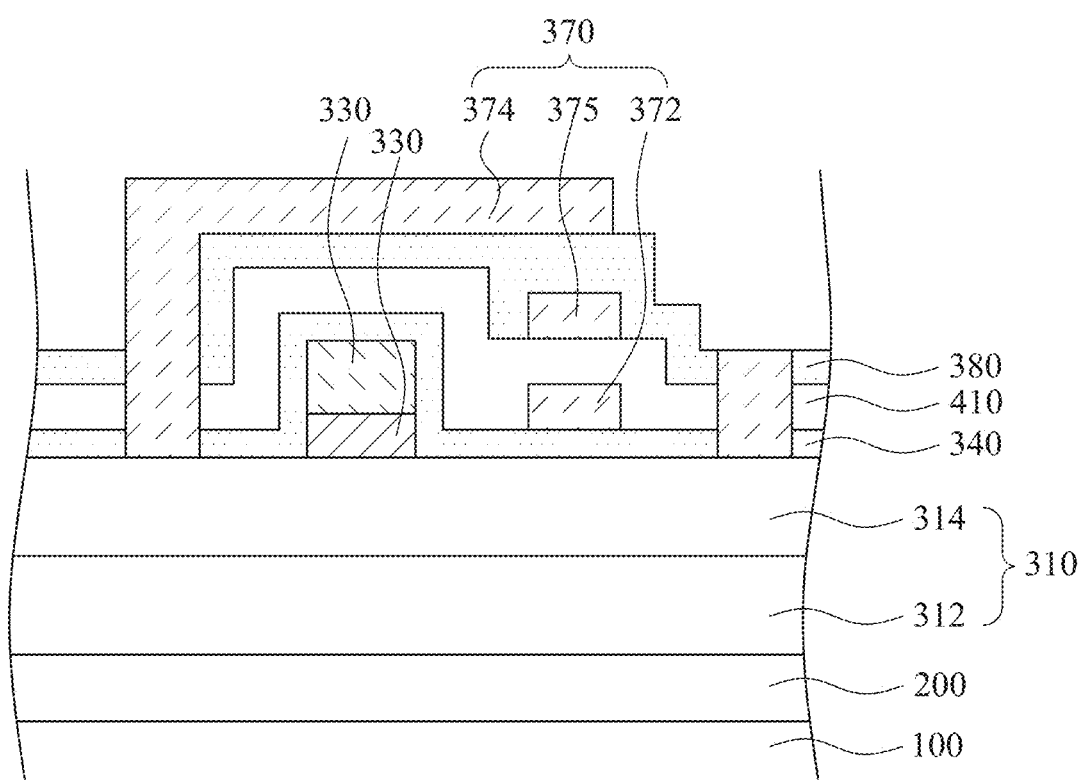

Reference is made to FIGS. 5A and 5D which are cross-sectional views of different stages of a method for manufacturing a semiconductor device according to the fifth embodiment of the present invention. The difference between the fifth embodiment and the third embodiment pertains to the configuration of the field plate 370. Reference is made to FIG. 5A. The manufacturing processes of FIG. 1A to FIG. 1O, and FIG. 3A to FIG. 3B are performed first. Since the relevant manufacturing details are all the same as the first and the third embodiments, and, therefore, a description in this regard will not be repeated hereinafter. Subsequently, an insulating layer 410 is formed to cover the first passivation layer 340 and the field dispersion portion 372. In some embodiments, the insulating layer 410 includes single layer or multiple layers. The insulating layer 410 can be deposited by plasma enhanced chemical vapor deposition.

Reference is made to FIG. 5B. An interlayer portion 375 is formed on the insulating layer 410. For example, another metal layer can be formed to cover the insulating layer 410. Subsequently, the metal layer can be patterned to form the interlayer portion 375 above the field dispersion portion 372. The metal layer can be deposited by e-beam evaporator, and patterning the metal layer can be performed by lithography and etching process.

Reference is made to FIG. 5C. A second passivation layer 380 is formed to cover the insulating layer 410 and the interlayer portion 375. In some embodiments, the second passivation layer 380 includes single layer or multiple layers. The second passivation layer 380 can be deposited by plasma enhanced chemical vapor deposition.

Subsequently, a source via hole 382 and a drain via hole 384 are formed in the second passivation layer 380, a source via hole 412 and a drain via hole 412 are formed in the insulating layer 410, and a source via hole 342 and a drain via hole 344 are formed in the first passivation layer 340. The source via holes 382, 412, and 342 together expose a portion of the active layer 310, and the drain via holes 384, 414, and 344 together expose another portion of the active layer 310. The p-type doped layer 320 is disposed between the source via hole 342 and the drain via hole 344. The source via hole 342, 382, and 412 and the drain via hole 344, 384, and 414 can be performed by lithography and etching process.

Reference is made to FIG. 5D. A source electrode 350 is formed in the source via hole 342, 412, and 382 (see FIG. 5C), a drain electrode 360 is formed in the drain via hole 344, 414, and 384 (see FIG. 5C), and an extending portion 374 is formed on the second passivation layer 380 to be electrically connected to the source electrode 350. For example, another metal layer can be formed to cover the second passivation layer 380 and is filled in all of the source via holes 342, 412, and 382 and the drain via holes 344, 414, and 384. Then, the metal layer can be patterned to form the source electrode 350, the drain electrode 360, and the extending portion 374. In this embodiment, the metal layer can be deposited by e-beam evaporator and be patterned by lithography and etching process.

Subsequently, the field dispersion portion 372 and the interlayer portion 375 are both electrically connected to the source electrode 350 and/or the extending portion 374, and the connecting method can be similar to the method shown in FIG. 3F, and therefore, a description in this regard will not be repeated hereinafter.

Structurally, the difference between the fifth embodiment and the third embodiment pertains to the configuration of the field plate 370. In this embodiment, the field plate 370 includes the field dispersion portion 372, the extending portion 374, and the interlayer portion 375. The interlayer portion 375 is disposed between the field dispersion portion 372 and the extending portion 374. More specifically, the interlayer portion 375 is disposed between the insulating layers 410 and the second passivation layer 380. Since the portion of the first passivation layer 340 under the field dispersion portion 372 has the second thickness T2 smaller than the first thickness T1, the field dispersion portion 372 is able to disperse the electric field between the p-type doped layer 320 and the active layer 310 efficiently. Other relevant structural details of the fifth embodiment are all the same as the third embodiment, and, therefore, a description in this regard will not be repeated hereinafter.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a semiconductor device, comprising:
   providing a substrate;
   forming an active layer on the substrate;
   forming a p-type doped layer on the active layer, wherein the p-type doped layer has a first thickness;
   forming a gate electrode on the p-type doped layer;
   forming a passivation layer to cover the gate electrode and the active layer after forming the gate electrode;
   forming a source via hole, a drain via hole, and a blind hole in the passivation layer, wherein the p-type doped layer is disposed between the source via hole and the blind hole, the blind hole is disposed between the p-type doped layer and the drain via hole, a portion of the passivation layer under the blind hole has a second thickness smaller than the first thickness; and
   respectively forming a source electrode, a conductive plate and a drain electrode in the source via hole, the blind hole, and the drain via hole.

2. The manufacturing method of claim 1, wherein the p-type doped layer is made of GaN or AlGaN doped with p-type dopants.

3. The manufacturing method of claim 1, wherein forming the blind hole comprises:
   forming a step at a side of the blind hole facing the active layer.

* * * * *